US006919241B2

(12) United States Patent
Kinzer et al.

(10) Patent No.: US 6,919,241 B2
(45) Date of Patent: Jul. 19, 2005

(54) SUPERJUNCTION DEVICE AND PROCESS FOR ITS MANUFACTURE

(75) Inventors: Daniel M. Kinzer, El Segundo, CA (US); Zhijun Qu, Torrance, CA (US); Kenneth Wagers, Los Angeles, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/613,327

(22) Filed: Jul. 3, 2003

(65) Prior Publication Data

US 2004/0097038 A1 May 20, 2004

Related U.S. Application Data

(60) Provisional application No. 60/442,316, filed on Jan. 22, 2003, and provisional application No. 60/394,037, filed on Jul. 3, 2002.

(51) Int. Cl.[7] .................... H01L 21/337; H01L 21/332

(52) U.S. Cl. ...................... 438/194; 438/136; 438/186; 438/192

(58) Field of Search ................................ 438/136, 140, 438/172, 186, 192, 194, 195, 212, 268

(56) References Cited

U.S. PATENT DOCUMENTS

| | | | | |
|---|---|---|---|---|
| 6,204,153 B1 | * | 3/2001 | Gardner et al. ............ | 438/478 |
| 6,611,021 B1 | * | 8/2003 | Onishi et al. .............. | 257/328 |

* cited by examiner

*Primary Examiner*—Amir Zarabian
*Assistant Examiner*—Pamela E Perkins
(74) *Attorney, Agent, or Firm*—Ostrolenk, Faber, Gerb & Soffen, LLP

(57) ABSTRACT

A process to make a low voltage (under 200 volts) superjunction device employs spaced P type implants into the generally central depth region of an epitaxially formed N layer. The wafer is then placed in a diffusion furnace and the spaced implants are driven upward and downward by 4 to 8 microns to form spaced P pylons in an N type epitaxial body. MOSgated structures are then formed atop each of the P pedestals. The total P charge of each pedestal is at least partially matched to the total N charge of the surrounding epitaxial material. The initial implant may be sandwiched between two discrete epitaxial layers.

10 Claims, 2 Drawing Sheets

SUPERJUNCTION DEVICE AND PROCESS FOR ITS MANUFACTURE

RELATED APPLICATION

This application is based on and claims benefit of U.S. Provisional Application No. 60/394,037, filed Jul. 3, 2002 and U.S. Provisional Application No. 60/442,316, filed Jan. 22, 2003 to which a claim of priority is hereby made.

FIELD OF THE INVENTION

This invention relates to MOSgated devices and more specifically relates to a novel superjunction type MOSgated device and processes for its manufacture.

BACKGROUND OF THE INVENTION

Superjunction devices are well known and normally employ greatly deepened spaced base regions or pedestals of one conductivity disposed in a drift region of the other conductivity. By balancing the charge of the deep bases to that of the drift layer so that they deplete one another when the device is in a blocking condition, it is possible to use a higher concentration for drift region, resulting in reduced on resistance during forward conduction of the device.

A major problem in superjunction devices is in the formation of the ultra-deep base region. Thus, a large number of epitaxial layers with respective base implants, mask layers, implants and diffusions are sequentially formed. The large number of process steps cause the devices to be very expensive. It would be desirable to provide a process with a reduced number of mask steps for the manufacture of a superjunction device.

BRIEF DESCRIPTION OF THE INVENTION

In accordance with the invention, a superjunction device is made particularly for lower voltage ranges, less than about 200 volts, in which a high concentration P implant layer (for an N channel device) is buried in the central portion of the depth of the epitaxial junction receiving layer and is then heated to cause it to expand upward and downward to form a pedestal type structure. A plurality of spaced pedestals of this kind are formed. Thereafter, a conventional MOSgated structure is formed atop each pedestals.

In a first embodiment of the invention, a first epitaxial layer is grown atop a substrate and spaced P type implants are applied to the surface of the first N type epitaxial layer. A second N type epitaxial layer of about the same thickness as the first is then grown atop the first layer and the spaced P type implants. The number of P type dopant charges is made about equal to the number of N type charges in the N type epi layers surrounding each pedestal. The two layer device is then heated, causing the implants to diffuse upward and downward, forming the plural P type posts or pedestals the N type epitaxial layers. A conventional MOSgated structure is then formed atop each of the pedestals, completing the device.

In a second embodiment of the invention, for example, for under 100 volt devices, a single epitaxial layer may be used, and a very high energy implant, for example 3 MeV, can implant boron or other atoms in the mid depth of the epitaxial layer. These are then vertically expanded by diffusion to form the desired pedestals.

DETAILED DESCRIPTION OF THE PREFERRED EMBODIMENTS

Figure 1:
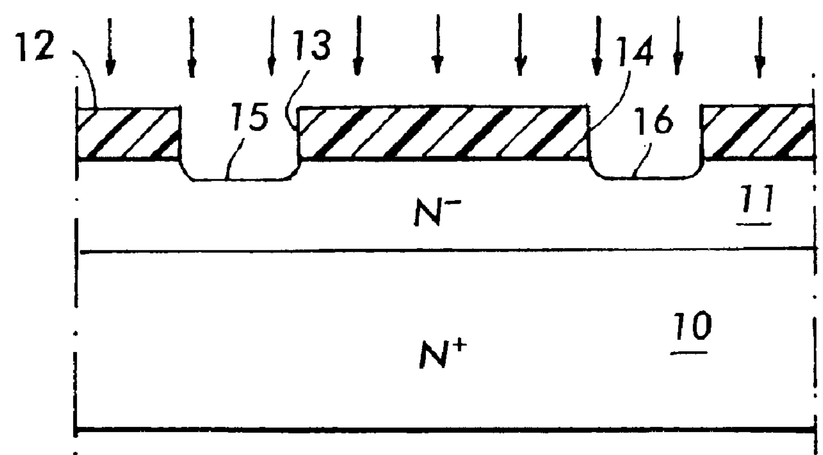
FIG. 1 is a cross-section of a small portion of a silicon wafer and shows the formation of a first epitaxial layer and the formation of implanted P regions on the upper surface of the first epitaxial layer.

Referring first to FIG. 1, a conventional $N^+$ silicon substrate 10 (a P substrate would be used for a P channel MOSFET) first has an $N^-$ epitaxial layer 11 grown thereon. For a 200 volt device, layer 11 may have a resistivity of about 1.5 ohm cm and a thickness of about 6 microns, the thickness and resistivity depending on the desired reverse voltage withstand of the devices being made.

The top surface of layer 11 is then masked with a suitable mask 12 having windows 13, 14 at locations corresponding to the locations desired for P type pedestals in an $N^-$ drift region. A boron implant, for example, at 50 KeV and a dose of about 1E13 per $cm^2$ is then applied to areas exposed by windows 13 and 14, shown as implants 15 and 16. These are not critical values.

Figure 2:
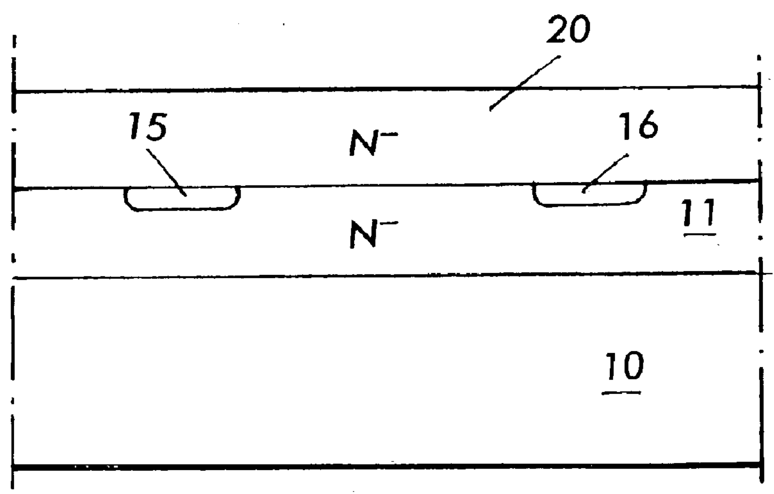
FIG. 2 shows the structure of FIG. 1 after the deposition of a second epitaxial layer.

The mask 12 is then stripped away and a second epitaxial layer 20 (FIG. 2) of thickness and resistivity, which may be the same as those of layer 11, is grown atop layer 11 and implants 15, 16.

Figure 3:
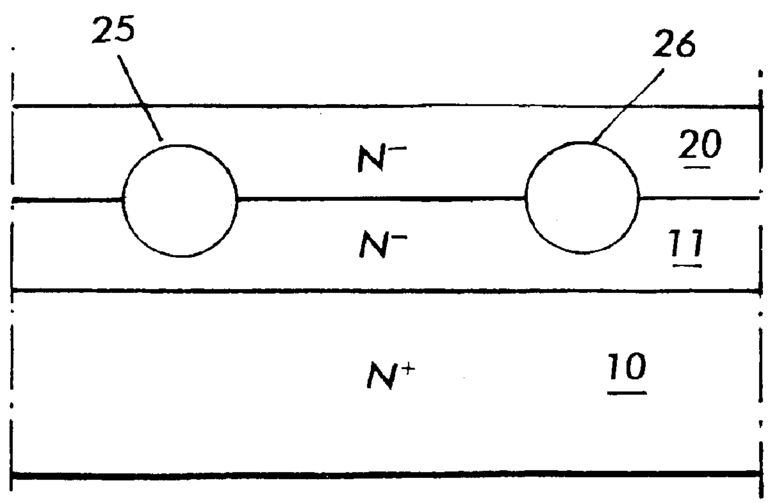
FIG. 3 shows the structure of FIG. 2 after diffusion to drive the implants upward and downward.

The wafer is next heated in a diffusion chamber, at a suitable temperature and time to cause the implants 15 and 16 to expand upward and downward by for example, about 2 to 4 microns in each direction, forming P type pedestals 25, 26 through a major portion of the thickness of epitaxial layers 11 and 20 as shown in FIG. 3.

Figure 4:
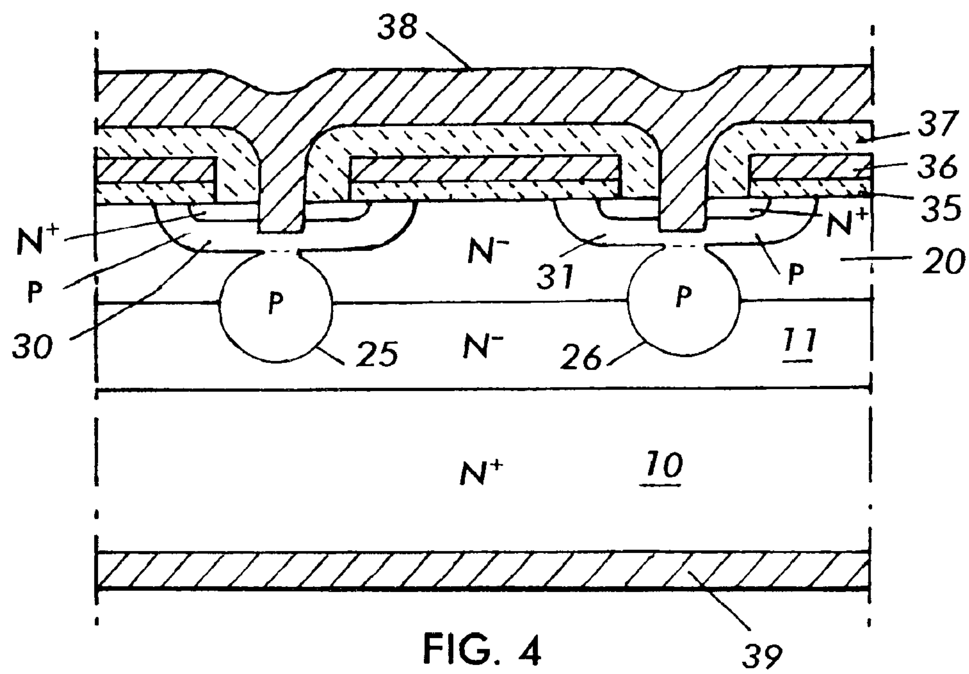
FIG. 4 shows the structure of FIG. 3 after the formation of a conventional MOSgate structure atop each of the pedestals of FIG. 3.

Thereafter a conventional MOSgate structure is formed atop layer 20 as shown in FIG. 4. This MOSgate structure includes P type channel regions 30 and 31 which are aligned with and merge into pedestals 25 and 26 respectively. The MOSgated structure also includes the conventional gate oxide 35, polysilicon gate 36, oxide insulation layer (LTO) 37 and source electrode 38. A drain electrode 39 is formed on the bottom of substrate 10.

Thus, pedestals 25 and 26 are stacks with opposite doping type from that of the epi layers 11 and 20 and of same doping type as channel areas 30 and 31. The total number of dopants (charges) in the pedestals is equal or close to the total number of dopant (charges) in the epi layers surrounding the pedestals in the style of conventional Superjunction devices so that the epi layers can be fully depleted during reverse voltage operation. The pedestals can extend all the way to the bottom of epi layer 11, depending on the desired trade-off relation of breakdown voltage and $R_{DSON}$. The lateral width of the pedestals can also vary for the same trade-off relation. The same concept is also applicable to a lateral device, and to devices formed in other semiconductor substrates than silicon.

Figure 5:
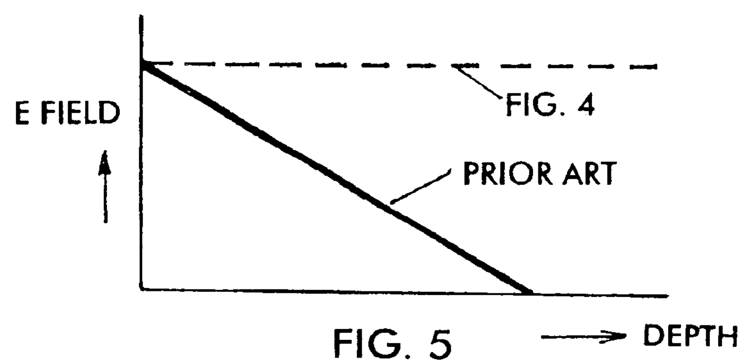
FIG. 5 shows the electric field distribution in the structure of FIG. 4 (in dotted lines) compared to that of a prior art structure.

By adding pedestals 25 and 26 to the traditional MOSFET structure, the electrical field distribution from the top to the bottom of the device is changed from a triangle shape (solid line in FIG. 5) to a rectangle shape (the dotted line in FIG. 5), i.e., the electrical field is uniformly distributed through the device. Thus, a low voltage material 11, 20 with higher dopant concentration can be used to fabricate high voltage device without concern of maximum depletion depth. Typically, this new concept can reduce the $R_{DSON}$ of a MOSFET by more than 65%.

Figure 6:
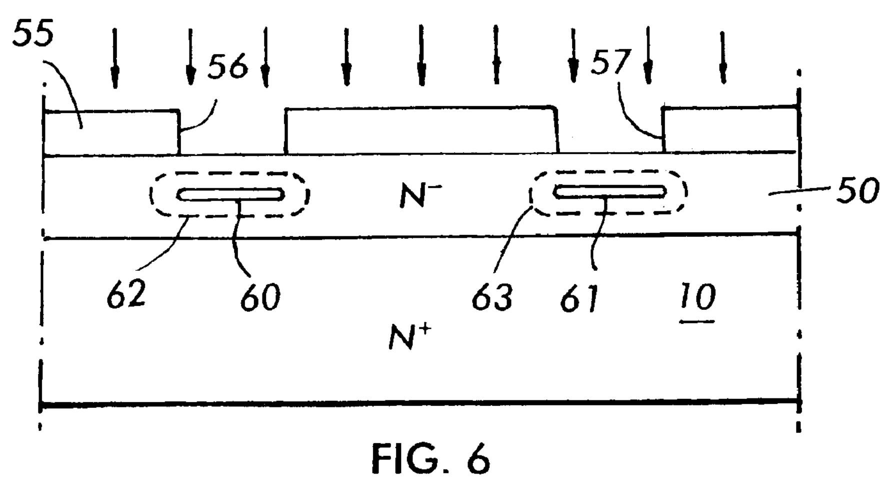
FIG. 6 shows a second embodiment of the invention in which high energy implants form implants in the central depth of a single epitaxial layer.

The same concept described above can also be applied to even lower voltage devices as shown in FIG. 6. In a traditional lateral device, the starting material epi thickness is relatively thin, typically less than 15 $\mu$m. With this type of thin epi material, a single high energy implantation method can be used to form the pedestals described above. One advantage of using implantation over a second epi deposition is that implantation usually can have a much better control of dose, which gives a tighter distribution on breakdown voltage and $R_{DSON}$ of the final product. Another advantage of using implantation in the process is simpler processors and the cycle time is shorter, making the whole process more manufacturable.

Thus, as shown in FIG. 6, a single epitaxial layer 50 about 6 microns thick is grown atop substrate 10, for a lower voltage device, for example, 100 volts. A mask 55 with windows 56 and 57 at locations at the desired pedestal locations is then formed. A boron implant is then carried out at a very high energy, for example, 3 MeV and a dose of about 1E13 deposits boron implants 60, 61 about midway in the depth of layer 50. Thereafter, a diffusion is carried out to drive the implants upward and downward (as shown in dotted lines) to form the desired pedestals 62 and 63 respectively.

Thereafter, the MOSgated structure is formed as shown in FIG. 4 to complete the device.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. The process for the manufacture of a substrate for a superjunction device, said process comprising the steps of: forming only a first epitaxial semiconductor layer of a given thickness and of a given impurity concentration of a first conductivity type atop a support body; forming a plurality of spaced implants of a second conductivity type on the surface of said first epitaxial layer; forming only a second epitaxial layer of a given thickness and of a given concentration and of said first conductivity type atop said first layer; and thereafter heating said substrate and said implants to cause said implants to diffuse downwardly into said first layer and upwardly into said second layer, thereby forming spaced pedestals of said second conductivity type within said first and second layers; the total charge of each of said pedestals being approximately equal to the total charge in the volume of said first and second layers which surrounds said pedestals, wherein said first epitaxial semiconductor layer and said second epitaxial semiconductor layer together form a single epitaxial layer, and wherein said pedestals are formed near a central region of said single epitaxial layer spaced from said support body.

2. The process of claim 1, in which said first and second layers are silicon.

3. The process of claim 1, wherein said first and second layers are of the same thickness and impurity concentration.

4. The process of claim 2, wherein said support body is a silicon wafer.

5. The process of claim 4, wherein said first and second layers are of the same thickness and concentration.

6. The process of claim 4, wherein said silicon wafer has the same conductivity type as said first and second layers.

7. The process for the manufacture of a superjunction device comprising the steps of: forming only a first epitaxial semiconductor layer of a given thickness and of a given impurity concentration of a first conductivity type atop a support body; forming a plurality of spaced implants of a second conductivity type on the surface of said first epitaxial layer; forming only a second epitaxial layer of a given thickness and of a given concentration and of said first concentration type atop said first layer; heating said substrate and said implants to cause said implants to diffuse downwardly into said first layer and upwardly into said second layer, thereby forming spaced pedestals of said second conductivity type within said first and second layers; the total charge of each of said pedestals being approximately equal to the total charge of the volume of said first and second layers which surrounds said pedestals; and thereafter forming MOSgated cell elements atop each of said pedestals wherein said first epitaxial semiconductor layer and said second epitaxial semiconductor layer together form a single epitaxial layer, and wherein said pedestals are formed in a central region of said single epitaxial layer spaced from said support body.

8. The process of claim 7, which further includes forming a drain electrode on the bottom of said support layer, and separating said support layer and said MOSgated cell elements into separate unitary elements.

9. The process of claim 7, wherein said support body is a silicon wafer.

10. The process of claim 9, wherein said silicon wafer has the same conductivity type as said first and second layers.

* * * * *